(12) United States Patent
Cook et al.

(10) Patent No.: US 10,867,880 B2
(45) Date of Patent: Dec. 15, 2020

(54) MULTI-DIE MODULE WITH SUBSTRATE CAVITY ASSEMBLY

(71) Applicant: TEXAS INSTRUMENTS INCORPORATED, Dallas, TX (US)

(72) Inventors: Benjamin Stassen Cook, Addison, TX (US); Bichoy Bahr, Allen, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/231,559

(22) Filed: Dec. 23, 2018

(65) Prior Publication Data

US 2020/0203244 A1    Jun. 25, 2020

(51) Int. Cl.

| H01L 23/31 | (2006.01) |
|---|---|
| H01L 23/538 | (2006.01) |
| H01L 23/00 | (2006.01) |
| H05K 1/14 | (2006.01) |

(52) U.S. Cl.
CPC ...... *H01L 23/3114* (2013.01); *H01L 23/5384* (2013.01); *H01L 24/48* (2013.01); *H01L 24/49* (2013.01); *H05K 1/141* (2013.01)

(58) Field of Classification Search
CPC . H01L 23/3114; H01L 23/5384; H01L 24/48; H01L 24/49; H05K 1/141
USPC .......................................................... 257/686
See application file for complete search history.

(56) References Cited

U.S. PATENT DOCUMENTS

| 2002/0130422 A1* | 9/2002 | Venkateshwaran ... H01L 21/563 257/778 |
|---|---|---|
| 2003/0148552 A1* | 8/2003 | Halahan ................ H01L 23/481 438/106 |
| 2003/0148597 A1* | 8/2003 | Tan ......................... H01L 24/29 438/612 |
| 2017/0104473 A1* | 4/2017 | Fukuzawa ............ H03H 9/0552 |
| 2018/0269272 A1* | 9/2018 | Cook ....................... H01L 23/66 |

* cited by examiner

*Primary Examiner* — Tong-Ho Kim
(74) *Attorney, Agent, or Firm* — Michael A. Davis, Jr.; Charles A. Brill; Frank D. Cimino (57) ABSTRACT

A multi-die module includes a first die with a first substrate and a first device formed over the first substrate, wherein the first substrate includes a cavity on a side opposite the first device. The multi-die module also includes a second die with a second substrate and a second device formed over the second substrate, wherein the second die is positioned at least partially in the cavity. The multi-die module also includes a coupler configured to convey signals between the first device and the second device.

22 Claims, 7 Drawing Sheets

MULTI-DIE MODULE WITH SUBSTRATE CAVITY ASSEMBLY

BACKGROUND

The proliferation of electronic devices with integrated circuit (IC) components continues. There are many different IC fabrication and packaging strategies, each strategy with its own pros and cons. Although IC fabrication technology provides an excellent platform for manufacturing circuits with repeated components, there are unmet challenges when it comes to manufacturing IC circuits with different types of components. The result of existing IC fabrication limitations is that IC components are often limited to a particular type of component and thus multiple IC dies or chips need to be connected together to complete a desired circuit.

While direct coupling of a first device on a first die and a second device on a second die is possible (e.g., using wires, pads, solder, etc.), avoiding direct coupling facilitates packaging. Alternatives to direct coupling includes contactless coupling options such as capacitive coupling and inductive coupling. However, in many scenarios, there are unwanted performance drawbacks resulting from contactless coupling. As an example, inductive coupling in an oscillator circuit (e.g., between a first die with a resonator and a second die with an oscillator core) undesirably reduces the quality factor of the oscillator circuit. Efforts to improve multi-die circuit packaging and performance are ongoing.

SUMMARY

In accordance with at least one example of the disclosure, a multi-die module comprises a first die with a first substrate and a first device formed over the first substrate, wherein the first substrate includes a cavity on a side opposite the first device. The multi-die module also comprises a second die with a second substrate and a second device formed over the second substrate, wherein the second die is positioned at least partially in the cavity. The multi-die module also comprises a coupler configured to convey signals between the first device and the second device.

In accordance with at least one example of the disclosure, a method for fabricating a multi-die module comprises obtaining a first die comprising a first device formed over a first substrate having a cavity on a side opposite the first device. The method also comprises obtaining a second die comprising a second substrate and a second device formed over the second substrate. The method also comprises positioning the second die at least partially in the cavity. The method also comprises providing a coupler configured to convey signals between the first device and the second device.

BRIEF DESCRIPTION OF THE DRAWINGS

For a detailed description of various examples, reference will now be made to the accompanying drawings in which.

DETAILED DESCRIPTION

The disclosed examples are directed to multi-die modules with a substrate cavity assembly. In at least some examples, the cavity is formed in a first substrate of a first die with a first device. Subsequently, a second die with a second device is positioned at least partially in the cavity (the second die is smaller than the first die). In some examples, the second die fits entirely within the cavity. In other examples, the second die only fits partially within the cavity. Also, a coupler is provided to enable signaling between the first device of the first die and the second device of the second die. In different examples, the number of substrate cavities for a first die (on a side opposite a first device of the first die), the number of dies, the number of devices for each die, and/or the number of couplers for a multi-die module vary. In different examples, multi-die module one die or multiple dies positioned at least partially in each substrate cavities (e.g., side-by-side or stacked).

In some examples, a coupler for a multi-die module with a substrate cavity assembly comprises a contact-based coupler such as a wirebond, a through-silicon via (TSV), and a through-glass via (TGV). In one example, a contact-based coupler comprises conductive material that extends between the first device and a surface of the first substrate corresponding to the cavity. Additionally or alternatively, the coupler comprises a contactless coupler configured to provide wireless signaling. Examples of contactless couplers includes capacitive couplers, inductive couplers, acoustic couplers, thermal couplers, photonic couplers, phononic couplers, electromagnetic couplers, optical couplers, and mechanical/vibrational couplers. In some examples, a contactless coupler is configured to convey wireless signals through a first substrate. As desired, combinations of contact-based couplers and/or contactless couplers are possible. Also, in different examples, coupler components are integrated with or otherwise extend to the cavity.

In some examples, a cavity has a shape that facilitates positioning and/or aligning the second die relative to the first die. For example, in some examples, if the second die has a known footprint, the cavity has an open shape that enables the second die to be lowered or dropped into the cavity (the open shape of the cavity is larger than the known footprint of the second die). In addition, in at least some examples, the cavity has slanted walls that help guide the second die to a target position within the cavity. Also, in some examples, surfaces of the first substrate associated with the cavity include a step surface, where the second die is positioned on the step surface.

In some examples, if the second die has a square footprint, a cavity with a truncated square pyramid shape would enable the second die to slide into a target position. In some examples, the target position is at a surface of the first die corresponding to the base of the cavity. In other examples, the target position leaves a gap between the second die and a surface of the first die corresponding to the base of the cavity. As another example, if the second die has a rectangular footprint, a cavity with a truncated rectangular pyramid shape would enable the second die to slide into a target position. Again, in different examples, the target position leaves no space between the second die and a surface of the first die corresponding to the base of the cavity, or leaves a gap between the second die and a surface of the first die corresponding to the base of the cavity. In one example, the gap between the second die and a surface of the first die corresponding to the base of the cavity enables movable components of the second device to function properly (e.g., a vibrating layer or platform of a micro-electro-mechanical system of the second device is able to move properly). In different examples, spaces or gaps between the second die and surfaces of the first die corresponding to the cavity are employed intentionally to facilitate adding or connecting coupler components configured to enable signaling between a first device of the first die and a second device of the second die. As desired, a filler material is added to the cavity (e.g., between surfaces of the first and second dies, to cover the second die, and/or to fill the cavity). In different examples, the filler material is flexible or rigid.

In some examples, using the cavity to guide the second die to a target position facilitates fabrication of a multi-die module. For example, in some examples, coupler components are aligned based on the cavity guiding the second die to a target position. In one example, coupler components included with or attached to the second die line up with coupler components included with or attached to the first die based on the cavity guiding the second die to a target position. In different examples, soldering and/or other coupling techniques are applied before or after the cavity guides the second die to a target position. In some examples, the cavity facilitates contactless coupling options for a multi-die module by bringing contactless coupler components closer together and/or aligning contactless coupler components of the second die with contactless coupler components of the first die. Without limitation, in some examples, the first device of the first die comprises an oscillator and the second device of the second die comprises a resonator. To provide a better understanding, various multi-die module options, cavity options, and coupler options are described using the figures as follows.

Figure 1:
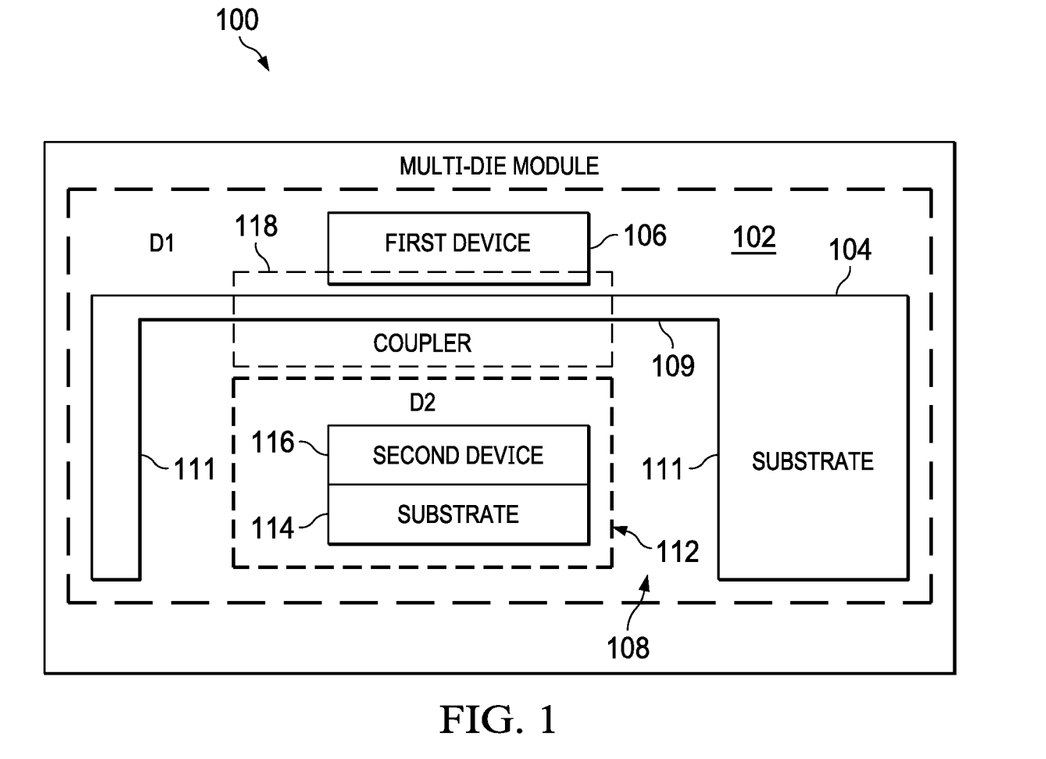
FIG. 1 shows a block diagram of a multi-die module in accordance with various examples.

FIG. 1 shows a block diagram of a multi-die module 100 in accordance with various examples. As shown, the multi-die module 100 includes a first die 102 with a first substrate 104 and a first device 106 formed over the first substrate 104. The first substrate 104 includes a cavity 108. In FIG. 1, a second die 112 of the multi-die module 100 is represented as being positioned within the cavity 108. The second die 112 includes a second substrate 114 and a second device 116. In other examples, the second die 112 only fits partially within the cavity 108. In different examples, the spacing between the second die 112 and surfaces of the first die corresponding to the cavity 108 varies. In some examples, the target position for the second die 112 corresponds to the second die 112 contacting a surface 109 of the first die 102 corresponding to a base of the cavity 108. In other examples, the target position for the second die 112 corresponds to the second die 112 being offset from the surface 109 of the first die 102 corresponding to a base of the cavity 108. In some examples, the target position for the second die 112 corresponds to the second die 112 contacting or being offset from surfaces 111 of the first die 102 corresponding to sides of the cavity 108. In the example of FIG. 1, the surfaces 111 are perpendicular to the surface 109. In other examples, the surfaces 111 are slanted relative to the surface 109, resulting in an opening for the cavity 108 that is larger than a length of the surface 109.

In at least some examples, the multi-die module 100 includes a coupler 118 that enables signaling between the first device 106 of the first die 102 and the second device 116 of the second die 112. In different examples, the coupler 118 corresponds to one or more contact-based coupler components (e.g., wirebonds, TSVs, TGVs) and/or contactless coupler components (e.g., capacitive coupler components, inductive coupler components, acoustic coupler components, thermal coupler components, photonic coupler components, phononic coupler components, electromagnetic coupler components, optical coupler components, and/or mechanical/vibrational coupler components). Without limitation, in some examples, the first device 106 of the first die 102 comprises an oscillator and the second device 116 of the second die 112 comprises a resonator, where the coupler 118 enables signaling between the oscillator and the resonator.

Figure 2:
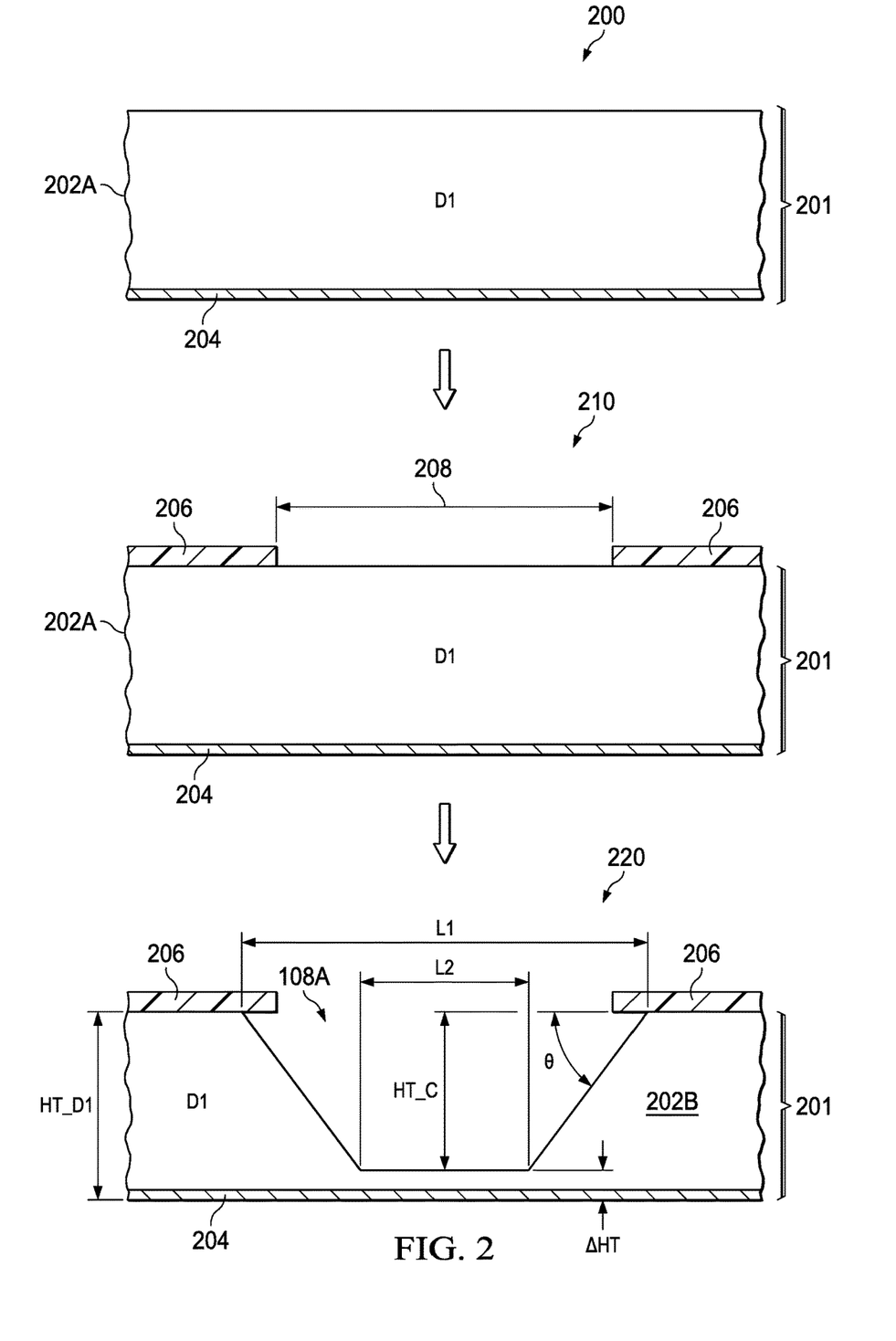
FIG. 2 shows an etching process to create a cavity in accordance with various examples.

FIG. 2 shows an etching process to create a cavity (e.g., the cavity 108 in FIG. 1) in accordance with various examples. In FIG. 2, scenarios 200, 210, and 220 show cross-sections of a first die 201 before, during, and after an etching process. In scenario 200, the first die 201 includes an initial substrate 202A and first device layers 202 formed over the initial substrate 202A. In one example, the first device layers 202 form the first device 106 represented in FIG. 1. As shown, the first die 201 is flipped so that the first device layers 202 face down to facilitate etching a cavity in the substrate 202A. In other examples, some or all of the first device layers 202 are formed after the etching process representing in FIG. 2 is complete.

In scenario 210, a masking layer 206 (e.g., a photoresistive material) is applied to the initial substrate 202A, where the masking layer 206 is modified or formed to have an open area 208. The open area 208 in the masking layer 206 in scenario 210 enables an etchant to contact only certain portions of the initial substrate 202A in scenario 210, resulting a modified substrate 202B in scenario 220 that includes a cavity 108A (an example of the cavity 108 in FIG. 1). An example shape for the cavity 108A formed in scenario 220 is represented in FIG. 3.

Figure 3:
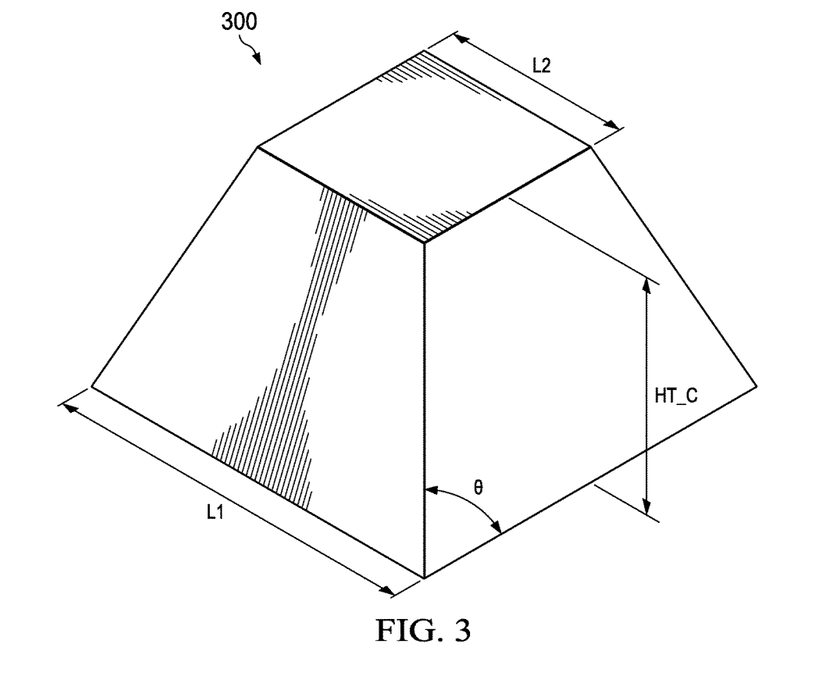
FIG. 3 shows a cavity shape related to the etching process of FIG. 2 in accordance with various examples.

In FIG. 3, a truncated square pyramid shape 300 is represented as having a base and a plateaued top. The truncated square pyramid shape 300 has a first length (L1) corresponding to a side length for its base, a second length (L2) corresponding to a side length for its plateaued top, and a height (HT_C). The sides of the truncated square pyramid shape 300 extend from the base to the plateaued top at a slope angle (θ) relative to the base. Returning to FIG. 2, in at least some examples, the shape of the cavity 108A corresponds to the truncated square pyramid shape 300 with L1 corresponding to the length of the open space 208 of the masking layer 206. In some examples, L1 is slightly larger than the length used of the open space 208 of the masking layer 206 due to an etchant undercutting the masking layer 206. Meanwhile, L2 corresponds to a length of a surface in the modified substrate 202B corresponding to the base of the cavity 108A (e.g., surface 109 in FIG. 1), and HT_C corresponds to the depth of the cavity 108A. Also, θ corresponds to the angle of surfaces of the modified substrate 202B corresponding to slanted sides of the cavity 108A (e.g., surfaces 111 in FIG. 1), where θ is relative to an initial plane for the cavity 108A (e.g., a virtual plane formed between the masking layer 206 and the substrate 202). As shown in scenario 220, the depth (HT_D1) of the cavity 108A is less than the height (HT_C) of the first die 201, and the difference is referred to as ΔHT (HT_D1−HT_C=ΔHT). In different examples, ΔHT varies. In scenario 220, ΔHT corresponds to the first device layers 204 as well as some substrate material of the modified substrate 202B that remains after the etching process to form the cavity 108A is complete.

In different examples, the etching process, the shape, and/or the size of the cavity 108A varies. In some examples, the sides of the cavity 108A have a curved shape. In other examples, the sides of the cavity 108A have a step shape (e.g., the resulting cavity looks like a stack of truncated pyramid shapes, where an upper truncated pyramid shape fits within the plateau of a lower truncated pyramid shape, and where uncovered plateau surfaces correspond to step surfaces of a substrate on which a die rests in some examples). As desired, multiple etching processes are combined to produce different linear, step, or curved slopes for substrate surfaces corresponding to the cavity. One example etching process uses potassium hydroxide (KOH), which results in linear slopes for the side walls, where $\theta$ is 54.7 degrees. In some examples, the size and shape of the cavity 108A depend on the desired size for L2 and/or $\Delta$HT. In one example, the open space 208 in the masking layer 206 corresponds to a rectangle area (e.g., a square or other rectangular area) and etching is applied for an amount of time that results in a truncated rectangular pyramid shape (e.g., shape 300) for the cavity 108A, where L2 has a target size and/or $\Delta$HT has a target value.

In some examples, the value of L2 is selected to match a footprint side length for a second die, such that the target position for the second die in the cavity 108A involves the second die contacting a surface of the modified substrate 202B corresponding to the base of the cavity 108A with no offset between the lower edges of the second die and surfaces of the modified substrate 202B corresponding to sides of the cavity 108A. In other examples, the value of L2 is selected to be smaller than a footprint side length for a second die, such that the target position for the second die involves a gap between the second die and a surface of the modified substrate 202B corresponding to the base of the cavity 108A. In some examples, the value of L2 is selected to be larger than a footprint side length of a second die, such that the target position for second die involves at least some of a surface of the modified substrate 202B corresponding to a base of the cavity 108A being uncovered. In some examples cavity 108A is sized to fit multiple dies inside (either side by side or stacked). Also, in some examples, a substrate includes multiples cavities such as cavity 108A, where a different die is positioned in each of the multiple cavities. In some examples, a given substrate cavity houses a die and another substrate cavity houses coupler components.

FIGS. 4A-4D show different multi-die layout options 400, 410, 420, and 430 in accordance with various examples. In the multi-die layout option 400 of FIG. 4A, a first die 102A (an example of the first die 102 in FIG. 1) with the cavity 108A described in FIG. 2 is represented. More specifically, the first die 102A in the layout option 400 includes the modified substrate 202B of FIG. 2 and first device layers 204A (an example of first device layers 204 in FIG. 2), where the first die 102A is flipped such that the first device layers 204A are face down (away from the second die 112A) and the cavity 108A is face up (towards the second die 112A). For the layout option 400, the second die 112A (an example of the second die 112 in FIG. 1) has a substrate 114A (an example of the substrate 114 in FIG. 1) and second device layers 402, where the second device layers 402 face down (towards the first die 102A) and are inside the cavity 108A. In other examples, the second die 112A is positioned face up in the cavity 108A, such that the second device layers 402 face away from the first die 102A.

Figure 4A:
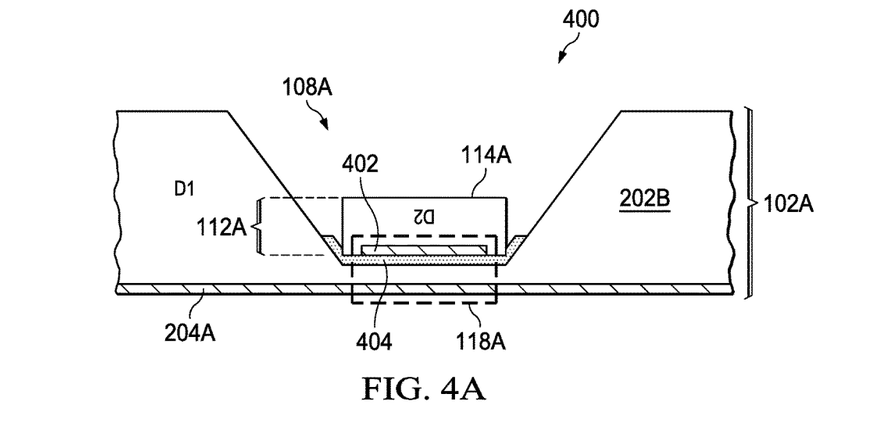
FIGS. 4A-4D show different multi-die layout options in accordance with various examples.

In the layout option 400, a filler material 404 is positioned between the second die 112A and a surface of the modified substrate 202B corresponding to a base of the cavity 108A. In some examples, the filler material 404 is a flexible material such as silicone or rubber. In other examples, the filler material 404 is a rigid material such as epoxy. In different examples, the amount of filler material 404 varies. In the layout option 400, some filler material 404 remains between the second die 112A and a surface of the modified substrate 202B corresponding to a base of the cavity 108A. Also, some filler material 404 remains between the second die 112A and surfaces of the modified substrate 202B corresponding to slanted sides of the cavity 108A. In other examples, the second die 112A contacts one or more surfaces of the modified substrate 202B corresponding to slanted sides of the cavity 108A.

With the layout option 400, a coupler 118A is provided to enable signaling between a first device (e.g., first device 106 in FIG. 1) corresponding to first device layers 204A of the first die 102A and a second device (e.g., second device 116 in FIG. 1) corresponding to second device layers 402 of the second die 112A. In some examples, the coupler 118A includes contact-based coupler components. In other examples, the coupler 118A includes contactless coupler components. In other examples, the coupler 118A includes a combination of contact-based coupler components and contactless coupler components. As desired, the filler material 404 is selected to have conductivity, permeability, and/or dielectric parameters that facilitate signaling between the first die 102A and the second die 112A. In one example, if the coupler 118A includes contact-based coupler components, the filler material 404 is selected to have low conductivity parameters (e.g., a conductivity value below a predetermined threshold). In another example, if the coupler 118A includes capacitive coupler components, the filler material 404 is selected to have a particular dielectric value or a dielectric value above a threshold. In another example, if the coupler 118A includes inductive coupler components, the filler material 404 is selected to have a particular permeability value or a permeability value above a threshold.

In the layout option 400, positioning the second die 112A inside the cavity 108A facilitates alignment of the second die 112A relative to the first die 102A. In other examples, the sizes for the cavity 108A, the first die 102A, and the second die 112A vary such that in the second die 112A is only partially in the cavity 108A. Regardless, the cavity 108A facilitates alignment of the second die 112A relative to the first die 102A. Once the alignment of the second die 112A relative to the first die 102A is as desired (the second die 112A is in its target position), their relative positions are set (e.g., using filler material 404, coupler components, and/or connectors), resulting in a multi-die combo device based on the cavity 108A and layout option 400. Once a multi-die combo device is obtained based on layout option 400, additional steps are performed to finish fabrication of a multi-die module that includes the multi-die combo device. Example steps include connecting bondwires to pads (not shown) of the multi-die combo device, adding insulative materials around some or all of the multi-die combo device, coupling the multi-die combo device to at least one other die, and packaging the multi-die combo device in a multi-pin package. In different examples, the orientation of a multi-die combo device varies once the multi-die combo device becomes part of a multi-die module.

Figure 4B:
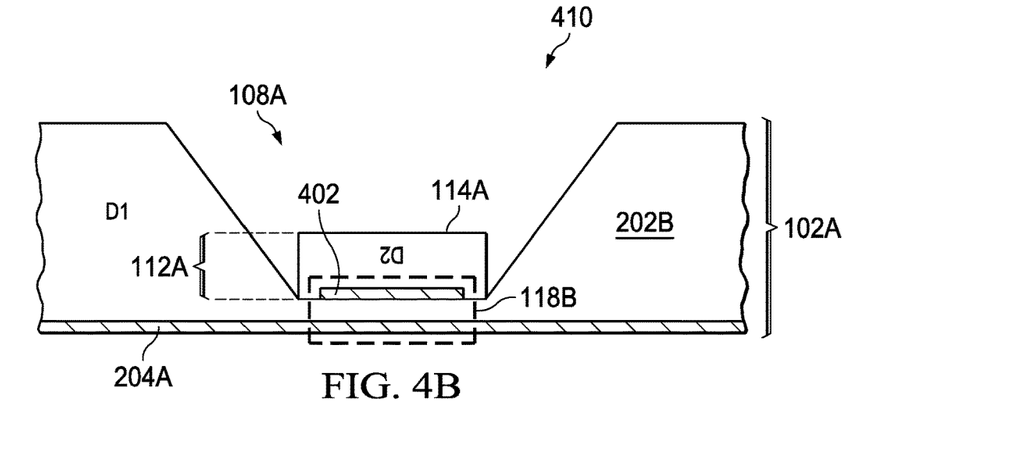

In the multi-die layout option 410 of FIG. 4B, the first die 102A with the cavity 108A described in FIG. 2 is again represented. Again, the first die 102A is flipped such that the first device layers 204A face down (away from the second die 112A) and the cavity 108A faces up (towards the second die 112A). For the layout option 410, the second device layers 402 of the second die 112A are positioned face down (towards the first die 102A) and are inside the cavity 108A. In other examples, the second die 112A is positioned face up in the cavity 108A, such that the second device layers 402 face away from the first die 102A.

With layout option 410, a coupler 118B is provided to enable signaling between a first device (e.g., first device 106) corresponding to first device layers 204A of the first die 102A and a second device (e.g., second device 116) corresponding to second device layers 402 of the second die 112A. In some examples, the coupler 118*6* includes contact-based coupler components. In other examples, the coupler 118B includes contactless coupler components. In other examples, the coupler 118B includes a combination of contact-based coupler components and contactless coupler components.

In the layout option 410, the second die 112A contacts a surface of the modified substrate 202B corresponding to a base of the cavity 108A with no play between the second die 112A and surfaces of the modified substrate 202B corresponding to slanted sides of the cavity 108A. In other words, the layout option 410 represents an idealized alignment scenario where no filler or gap is between the second die 112A and a surface of the modified substrate 202B corresponding to a base of the cavity 108A. Likewise, for layout option 410, there is no filler or gap between the second die 112A and surfaces of the modified substrate 202B corresponding to slanted sides of the cavity 108A. In some examples, some play or gaps between the second die 112A and surfaces of the first die 102A corresponding to the cavity 108A is acceptable, or even desirable for some scenarios. In one example, the second die 112A contacts five surfaces (e.g., surfaces corresponding to a base and four sides of the cavity 108A) of the first die 102A. In another example, the second die 112A contacts four surfaces (e.g., surfaces corresponding to a base and three sides of the cavity 108A) of the first die 102A, such that some of the surface of the first die 102A corresponding to a base of the cavity 108A uncovered. In another example, the second die 112A contacts three surfaces (e.g., surfaces corresponding to a base and two opposite sides of the cavity 108A) of the first die 102A, leaving some of the surface of the first die 102A corresponding to a base of the cavity 108A uncovered and enabling limited movement (e.g., one-directional movement) of the second die 112A relative to the first die 102A. Such movement facilitates connecting some coupler components.

In the layout option 410, positioning the second die 112A inside the cavity 108A facilitates alignment of the second die 112A relative to the first die 102A. In other examples, the sizes for the cavity 108A, the first die 102A, and the second die 112A vary such that in the second die 112A is only partially in the cavity 108A. Regardless, the cavity 108A facilitates alignment of the second die 112A relative to the first die 102A. Once the alignment of the second die 112A relative to the first die 102A is as desired, their relative positions are set (e.g., using coupler components and/or connectors), resulting in a multi-die combo device based on the cavity 108A and layout option 410. Once a multi-die combo device is obtained based on layout option 410, additional steps are performed to finish fabrication of a multi-die module that includes the multi-die combo device. Example steps include connecting bondwires to pads (not shown) of the multi-die combo device, adding insulative materials around some or all of the multi-die combo device, coupling the multi-die combo device to at least one other die, and packaging the multi-die combo device in a multi-pin package. In different examples, the orientation of a multi-die combo device varies once the multi-die combo becomes part of a multi-die module.

Figure 4C:
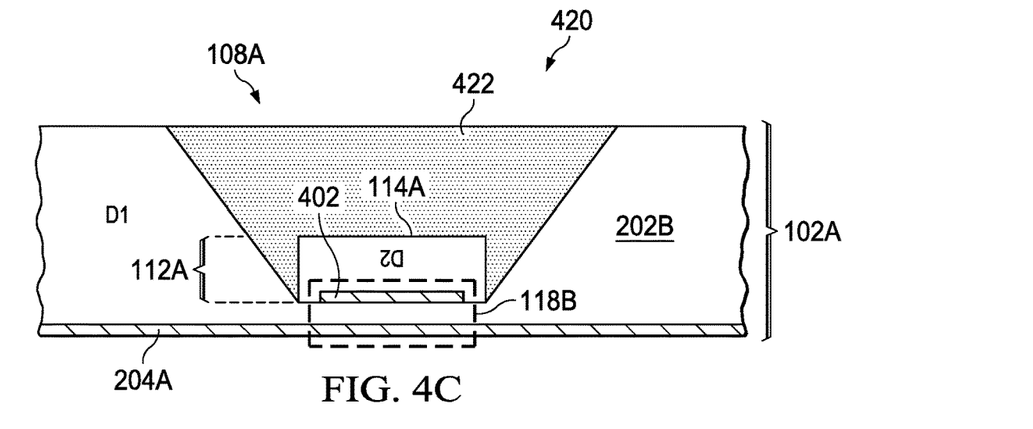

The multi-die layout option 420 of FIG. 4C is the same as the multi-die layout option 410 of FIG. 4B, except that a filler material 422 is added once the second die 112A is in its target position in the cavity 108A. In the layout option 420, the filler material 422 fills the cavity 108A. In some examples, the filler material 422 is a flexible material such as silicone or rubber. In other examples, the filler material 422 is a rigid material such as epoxy. In different examples, the amount of filler material 422 varies. In one example, some of the cavity 108A remains unfilled after the filler material 422 is applied. In another example, the filler material 422 extends beyond the cavity 108A.

As desired, the filler material 422 is selected to have conductivity, permeability, and/or dielectric parameters that facilitate signaling between the first die 102A and the second die 112A. In one example, if the coupler 118B includes contact-based coupler components, the filler material 422 is selected to have low conductivity parameters (e.g., a conductivity value below a predetermined threshold). In another example, if the coupler 118*6* includes capacitive coupler components, the filler material 422 is selected to have a particular dielectric value or a dielectric value above a threshold. In another example, if the coupler 118*6* includes inductive coupler components, the filler material 422 is selected to have a particular permeability value or a permeability value above a threshold.

Figure 4D:
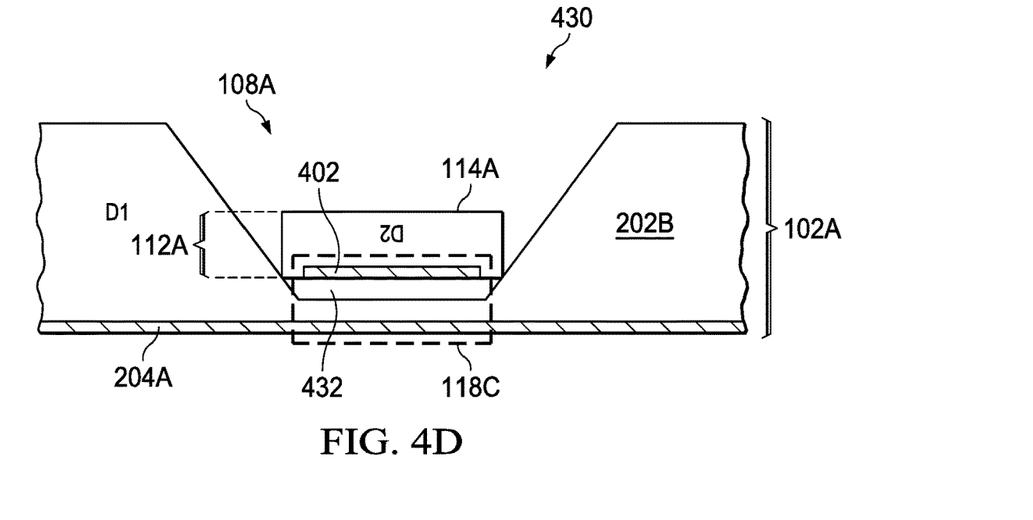

In the multi-die layout option 430 of FIG. 4D, the first die 102A with the cavity 108A described in FIG. 2 is again represented. Again, the first die 102A is flipped such that the first device layers 204A face down (away from the second die 112A) and the cavity 108A faces up (towards the second die 112A). For the layout option 430, the second device layers 402 of the second die 112A are positioned face down (towards the first die 102A) and are inside the cavity 108A. In other examples, the second die 112A is positioned face up in the cavity 108A, such that the second device layers 402 face away from the first die 102A.

With layout option 430, a coupler 118C is provided to enable signaling between a first device (e.g., first device 106) corresponding to first device layers 204A of the first die 102A and a second device (e.g., second device 116) corresponding to second device layers 402 of the second die 112A. In some examples, the coupler 118C includes contact-based coupler components. In other examples, the coupler 118C includes contactless coupler components. In other examples, the coupler 118C includes a combination of contact-based coupler components and contactless coupler components.

In the layout option 430, the second die 112A contacts surfaces of the modified substrate 202B corresponding to slanted sides of the cavity 108A such that there is no play between the second die 112A and surfaces of the modified substrate 202B corresponding to slanted sides of the cavity 108A. Also, for layout option 430, gap 432 remains between the second die 112A and a surface of the modified substrate 202B corresponding to a base of the cavity 108A. In other examples, some play or gaps between the second die 112A and surfaces of the first die 102A corresponding to slanted sides of the cavity 108A is acceptable, or even desirable for some scenarios. In one example, the second die 112A contacts four surfaces (e.g., surfaces corresponding to four sides of the cavity 108A) of the first die 102A and covers a surface of the modified substrate 202B corresponding to a base of the cavity 108A. In another example, the second die 112A contacts three surfaces (e.g., surfaces corresponding three sides of the cavity 108A) of the modified substrate 202B, leaving some of a surface of the modified substrate 202B corresponding to a base of the cavity 108A uncovered. In another example, the second die 112A contacts two surfaces (e.g., surfaces corresponding to two opposite sides of the cavity 108A) of the first die 102A, leaving some of a surface of the modified substrate 202B corresponding to a base of the cavity 108A uncovered and enabling limited movement (e.g., one-directional movement) of the second die 112A relative to the first die 102A.

In the layout option 430, positioning the second die 112A inside the cavity 108A facilitates alignment of the second die 112A relative to the first die 102A and leaves the gap 432 between second device layers 402 and a surface of the first die 102A corresponding to a base of the cavity 108A. The gap 432 facilitates operations of a second device related to the second device layers 402 and/or facilitates installation of the coupler 118C. In some examples, the sizes for the cavity 108A, the first die 102A, and the second die 112A vary such that the second die 112A is only partially in the cavity 108A. Regardless, the cavity 108A facilitates alignment of the second die 112A relative to the first die 102A. Once the alignment of the second die 112A relative to the first die 102A is as desired, their relative positions are set (e.g., using coupler components and/or connectors), resulting in a multi-die combo device based on the cavity 108A and layout option 430. Once a multi-die combo device is obtained based on layout option 430, additional steps are performed to finish fabrication of a multi-die module that includes the multi-die combo device. Example steps include connecting bondwires to pads (not shown) of the multi-die combo device, adding insulative materials around some or all of the multi-die combo device, coupling the multi-die combo device to at least one other die, and packaging the multi-die combo device in a multi-pin package. In different examples, the orientation of a multi-die combo device varies once the multi-die combo becomes part of a multi-die module.

Figure 5A:
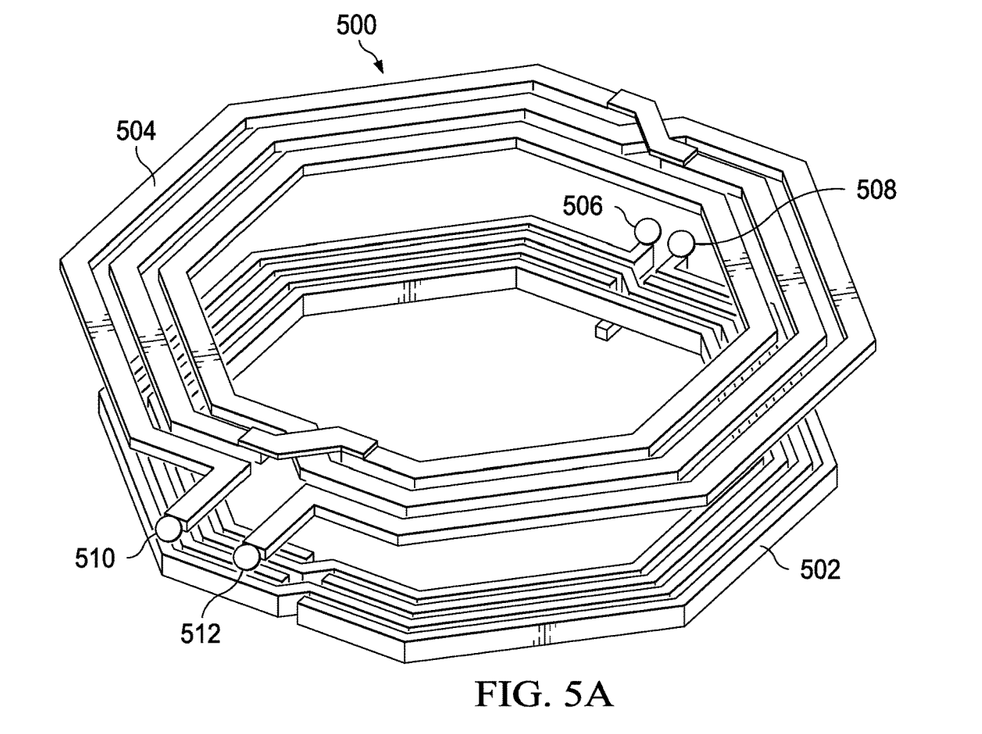
FIGS. 5A-5D show different coupler options for a multi-die module in accordance with various examples.

FIGS. 5A-5D show different coupler options for a multi-die module in accordance with various examples. In FIG. 5A, an inductive coupler 500 is represented. As shown, the inductive coupler 500 includes a first inductive coil 502 and a second inductive coil 504 (e.g., planar inductive coils), where the spacing and alignment of the first inductive coil 502 relative to the second inductive coil 504 affects signaling efficiency. Also, the first and second inductive coils 502 and 504 include respective connection points 506, 508 and 510, 512. In some examples, when assembled as part of a multi-die module, the connection points 506 and 508 of the first inductive coil 502 are coupled to a first device of a first die (e.g., the first device 106 in FIG. 1), and the connection points 510 and 512 of the second inductive coil 504 are coupled to a second device of a second die (e.g., the second device 116 in FIG. 1). In different examples, a first die (e.g., the first die 102 in FIG. 1) includes the first inductive coil 502 and a second die (e.g., the second die 112 of FIG. 1) includes the second inductive coil 504. In other examples, a first die (e.g., the first die 102 in FIG. 1) includes both the first and second inductive coils 502 and 504, where one of the coils has more windings than the other. In other examples, a second die (e.g., the second die 112 in FIG. 1) includes both the first and second inductive coils 502 and 504, where one of the coils has more windings than the other. In other examples, one or both of the first and second inductive coils 502 and 504 are fabricated separately from a first and second die (e.g., the first and second dies 102 and 112 in FIG. 1), and are later added when fabricating a multi-die module with first and second dies aligned using a cavity (e.g., cavity 108A in FIG. 2) as described herein.

Figure 5B:
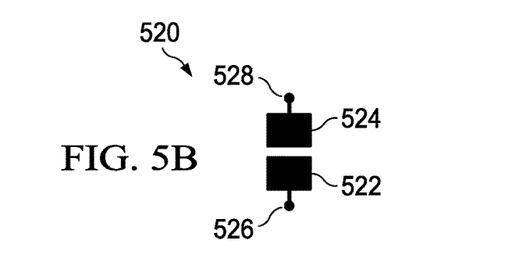

In FIG. 5B, a contactless coupler 520 is represented. As shown, the contactless coupler 520 includes a first contactless coupler transceiver 522 and a second contactless coupler transceiver 524. In different examples, the contactless coupler transceiver 522 correspond to capacitive coupler terminals, inductive coils (see e.g., FIG. 5A), acoustic transceivers, thermal transceivers, photonic transceivers, phononic transceivers, electromagnetic transceivers, optical transceivers, and mechanical/vibrational transceivers. In some examples, the spacing and alignment of the first contactless coupler transceiver 522 relative to the second contactless coupler transceiver 524 affects signaling efficiency. As represented in FIG. 5B, the first and second contactless coupler transceivers 522 and 522 include respective connection points 526 and 528. In some examples, when assembled as part of a multi-die module, the connection point 526 of the first contactless coupler transceiver 522 is coupled to a first device of a first die (e.g., the first device 106 in FIG. 1) and the connection point 528 of the second contactless coupler transceiver 524 is coupled to a second device of a second die (e.g., the second device 116 in FIG. 1). In different examples, a first die (e.g., the first die 102 in FIG. 1) includes the first contactless coupler transceiver 522 and a second die (e.g., the second die 112 of FIG. 1) includes the second contactless coupler transceiver 524. In other examples, a first die (e.g., the first die 102 in FIG. 1) includes both the first and second contactless coupler transceivers 522 and 524. In other examples, a second die (e.g., the second die 112 in FIG. 1) includes both the first and second contactless coupler transceivers 522 and 524. In other examples, one or both of the first and second contactless coupler transceivers 522 and 524 are fabricated separately from a first and second die (e.g., the first and second dies 102 and 112 in FIG. 1), and are later added when fabricating a multi-die module with first and second dies assembled using a cavity (e.g., cavity 108A in FIG. 2). In some examples, multiple contactless couplers are used for signaling between a first device of a first die and a second device of a second die.

Figure 5C:
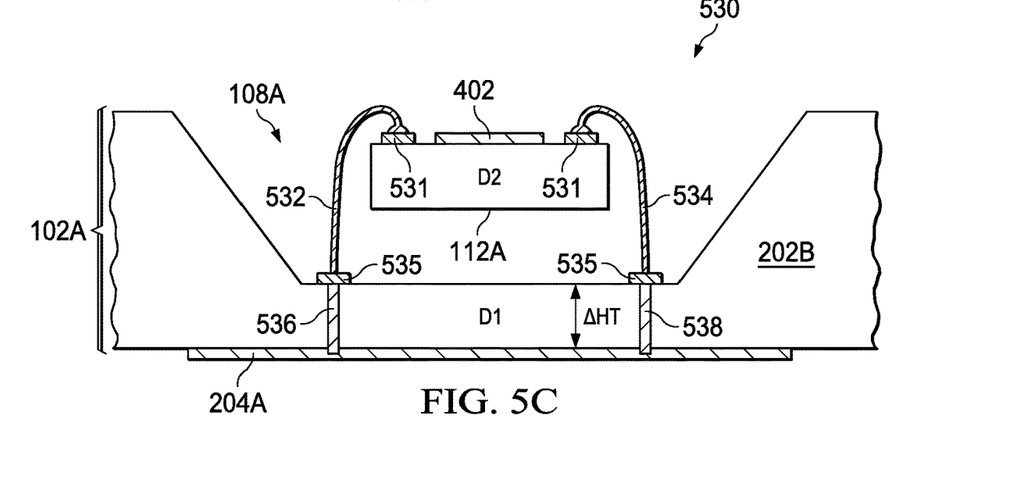

In FIG. 5C, a first contact-based coupler scenario 530 is represented. In scenario 530, a second die 112A is positioned in a cavity 108A with its second device layers 402 face up (facing away from the first die 102A). As previously discussed, the cavity 108A is formed in a modified substrate 202B of the first die 102A. To couple a second device of the second die 112A corresponding to the second device layers 402 to a first device of the first die 102A corresponding to first device layers 204A, wirebonds 532 and 534, and TSVs 536 and 538 are employed. More specifically, the wirebonds 532 and 534 extend from respective pads 531 located on the same side of the second die 112A as the second device layers 402 (the pads 531 couple to the second device layers 402 as desired). In some examples, the pads 531 are on an opposite side of the second die 112A relative to the second device layers 402 (e.g., connectors extend between the second device layers 402 and the pads 531). Regardless of the position of the pads 531, the wirebonds 532 and 534 extend from the pads 531 to a surface of the first die 102A corresponding to a base of the cavity 108A and couple to respective pads 535 of the first die 102A. Each of the pads 535 couples to one of the TSVs 536 and 538, which extend through substrate 202B to the first device layers 204A. In at least some examples, the lengths of the TSVs 536 and 538 correspond to ΔHT (the difference between the height of the first die 102A and the height of the cavity 108A).

Figure 5D:
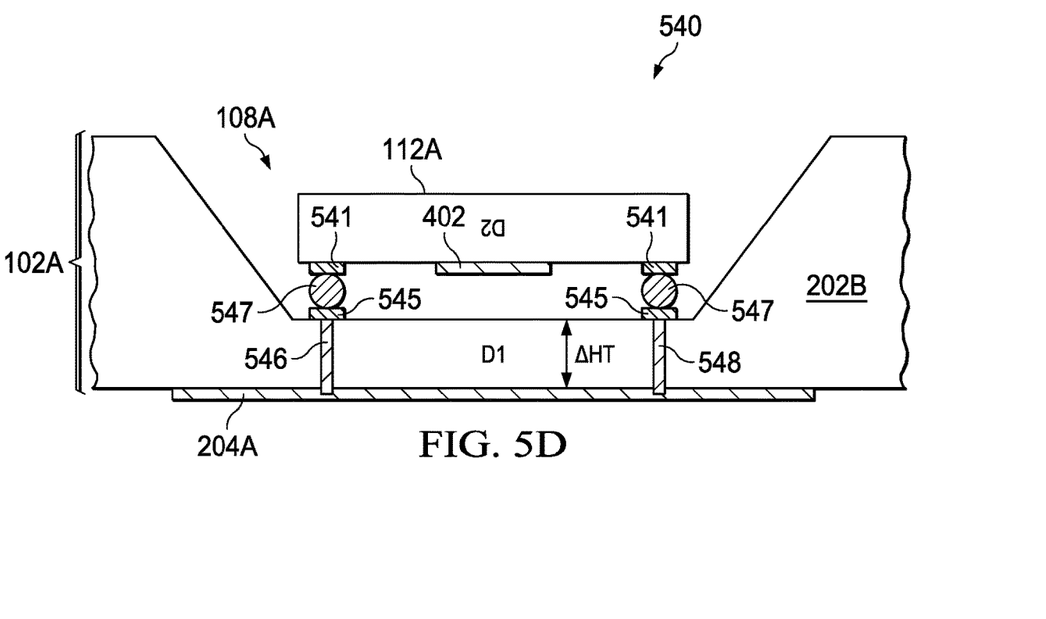

In FIG. 5D, a second contact-based coupler scenario 540 is represented. In scenario 540, a second die 112A is positioned in a cavity 108A with its second device layers 402 face down (facing towards the first die 102A). To couple a second device of the second die 112A corresponding to the second device layers 402 to a first device of the first die 102A corresponding to first device layers 204A, solder dots 547, and TSVs 546 and 548 are employed. More specifically, the solder dots 547 extend from pads 541 located on the same side of the second die 112A as the second device layers 402 (the pads 541 couple to the second device layers 402 as desired). In some examples, the pads 541 are on an opposite side of the second die 112A relative to the second device layers 402 (e.g., connectors extend between the second device layers 402 and the pads 541). Regardless of the position of the pads 541, the solder dots 547 extend from the pads 541 to a surface of the first die 102A corresponding to a base of the cavity 108A and couple to respective pads 545 of the first die 102A. Each of the pads 545 couples to one of the TSVs 546 and 548, which extend through substrate 202B to the first device layers 204A. In at least some examples, the lengths of the TSVs 546 and 548 correspond to ΔHT (the difference between the height of the first die 102A and the height of the cavity 108A) plus or minus some offset as desired. In some examples, the pads 541 do not align with the TSVs 546 and 548. In such case, wirebonds are used instead of solder dots 547 to couple the pads 541 to respective pads 545 and TSVs 546, 548.

In the scenarios 530 and 540 of FIGS. 5C and 5D, a surface of the first die 102A corresponding to a base of the cavity 108A is represented as having a size that is larger than a footprint of the second die 112A (e.g., to facilitate installation of contact-based coupler components). In some examples, contact-based coupler components are used even when the surface of the first die 102A corresponding to a base of the cavity 108A has a size that is the same as or is smaller than the footprint of the second die 112A (see e.g., FIGS. 4B and 4C).

Figure 6A:
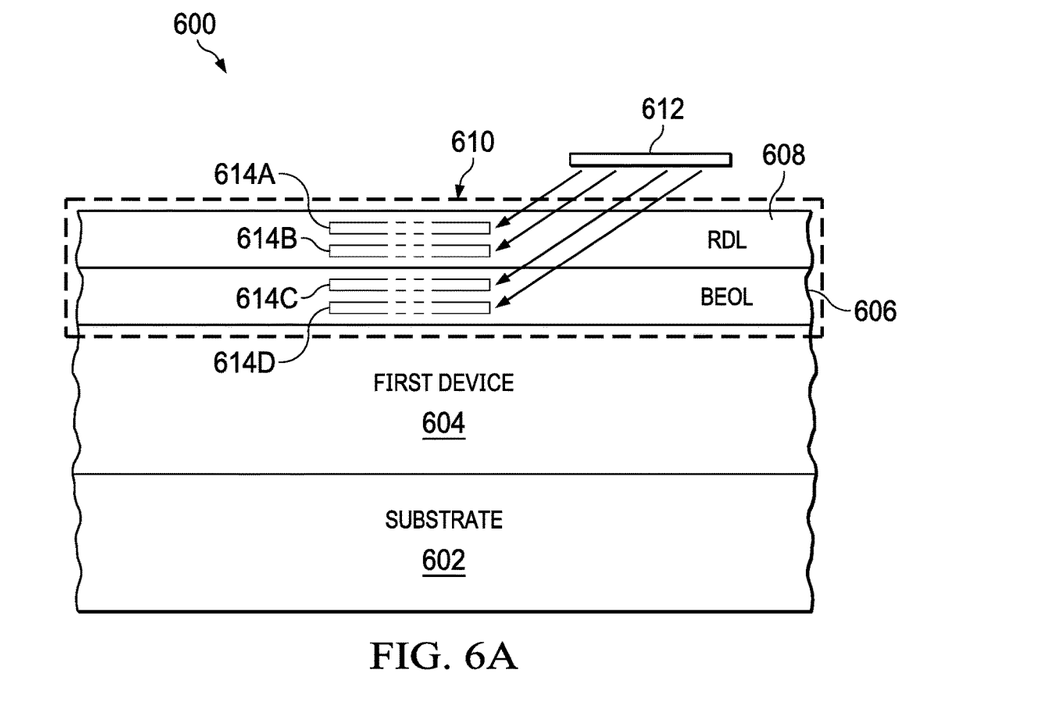
FIGS. 6A and 6B show different die and coupler arrangements in accordance with various examples.

FIGS. 6A and 6B show different die and coupler arrangements 600 and 620 in accordance with various examples. In the arrangement 600 of FIG. 6A, various portions for a first die (e.g., the first die 102 in FIG. 1) are represented, including a substrate 602, first device layers 604 (to form components of the first device 106), backend stack layers 606 (sometimes referred to as "BEOL" in industry), and a redistribution layer (RDL) 608. The backend stack layers 606 correspond to metal interconnections and insulative layers above the first device layers 604, and are used to connect components formed by the first device layers 604 together. As desired, additional components (e.g., contact-based coupler components and/or contactless coupler components) are added to the backend stack layers 606. Meanwhile, the RDL 608 corresponds to metal interconnections and insulative layers to reposition connection points (conductive paths) for components formed by the first device layers 604. As desired, additional components (e.g., contact-based coupler components and/or contactless coupler components) are added to the RDL 608. The RDL 608 connects to the first device layers 604 directly or through the backend stack layers 606, and facilitates packaging options. In the arrangement 600, the backend layers 606 and RDL 688 are part of an optional portion 610 of a first die that includes substrate 602 and first device layers 604.

In different examples, a coupler component 612 (e.g., a contact-based coupler component and/or contactless coupler component) resides in an upper portion 614A of the RDL 608. In other examples, the coupler component 612 resides in a lower portion 614B of the RDL 608. In other examples, a coupler component 612 resides in an upper portion 614C of the backend stack layers 606. In other examples, the coupler component 612 resides in a lower portion 614D of the backend stack layers 606.

Figure 6B:
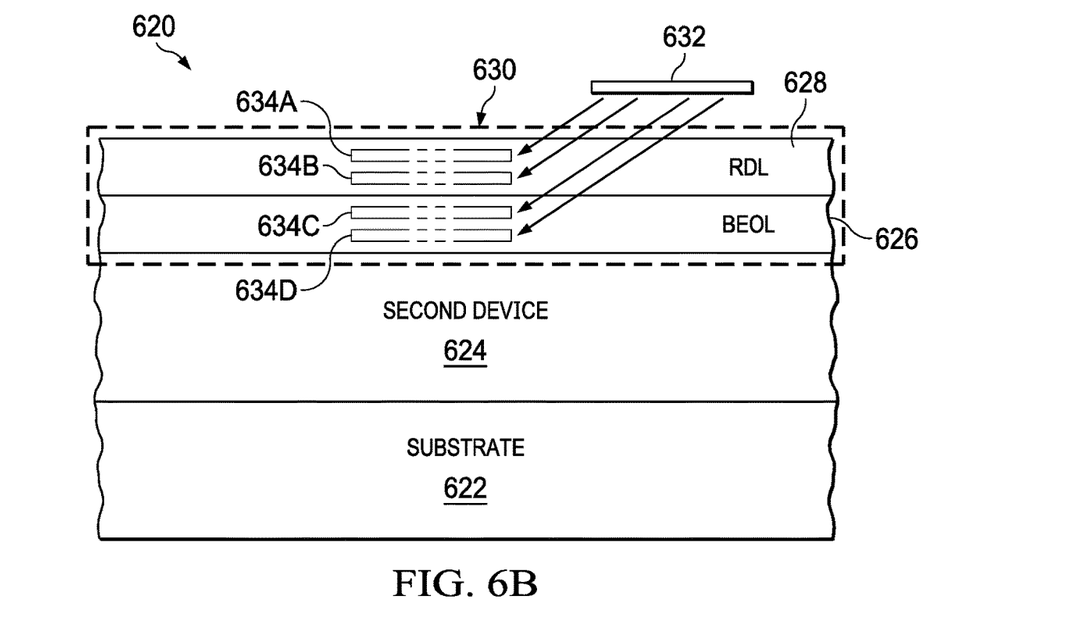

In the arrangement 620 of FIG. 6B, various portions for a second die (e.g., the second die 112 in FIG. 1) are represented, including a substrate 622, second device layers 624 (to form components of the second device 116), backend stack layers 626, and an RDL 628. The backend stack layers 626 correspond to metal interconnections and insulative layers above the second device layers 624, and are used to connect components formed by the second device layers 624 together. As desired, additional components (e.g., contact-based coupler components and/or contactless coupler components) are added to the backend stack layers 626. Meanwhile, the RDL 628 corresponds to metal interconnections and insulative layers to reposition connection points (conductive paths) for components formed by the second device layers 624. As desired, additional components (e.g., contact-based coupler components and/or contactless coupler components) are added to the RDL 628. The RDL 628 connects to the second device layers 624 directly or through the backend stack layers 626, and facilitates packaging options. In the arrangement 620, the backend layers 626 and the RDL 628 are part of an optional portion 630 of a second die that includes substrate 622 and second device layers 624.

In different examples, a coupler component 632 (e.g., a contact-based coupler component and/or contactless coupler component) resides in an upper portion 634A of the RDL 628. In other examples, the coupler component 632 resides in a lower portion 634B of the RDL 628. In other examples, a coupler component 632 resides in an upper portion 634C of the backend stack layers 626. In other examples, the coupler component 632 resides in a lower portion 634D of the backend stack layers 626.

In the die arrangements 600 and 620 represented in FIGS. 6A and 6B, the coupler components 612 and 632 are fabricated with the dies used to form a multi-die module (e.g., module 100 in FIG. 1). In other examples, the coupler components 612 and 632 are fabricated separately from the dies used to form a multi-die module (e.g., module 100 in FIG. 1). In other examples, part of the coupler components 612 and 632 are fabricated with the dies used to form a multi-die module, while part of the coupler components 612 and 632 are fabricated separately from the dies used to form a multi-die module. As needed, some or all of the coupler components 612 and 632 are added when forming a multi-die module based on a cavity (e.g., the cavity 108A) as described herein.

Figure 7:
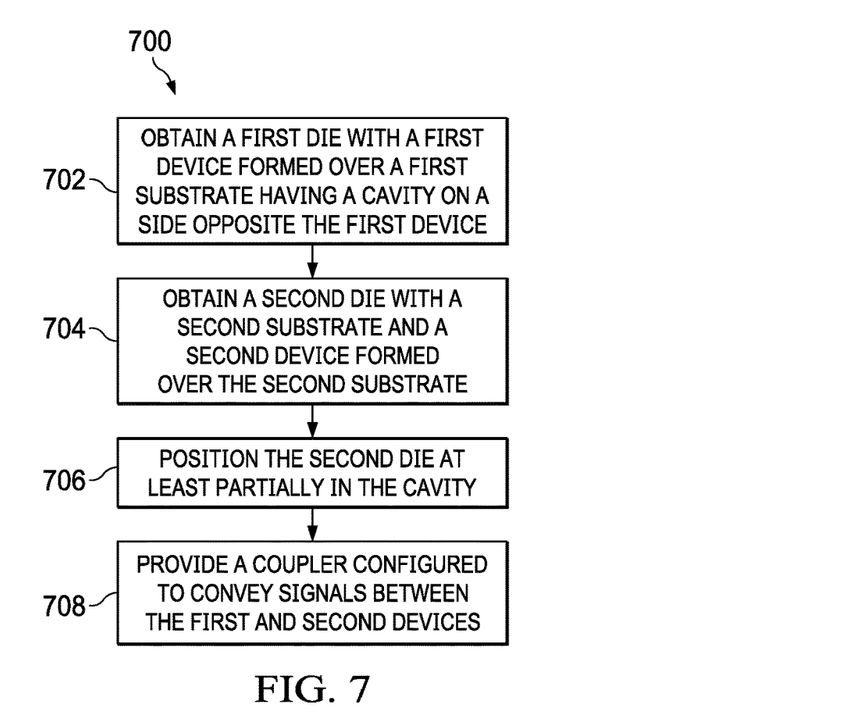
FIG. 7 shows a flowchart of a multi-die module fabrication method in accordance with various examples.

FIG. 7 shows a flowchart of a multi-die module fabrication method 700 in accordance with various examples. In method 700, a first die (e.g., first die 102) with a first device (first device 106) formed over a first substrate (e.g., substrate 104) having a cavity (e.g., cavity 108) on a side opposite the first device is obtained at block 702. At block 704, a second die (e.g., second die 112) with a second substrate (e.g., substrate 114) and a second device (e.g., second device 116) formed over the second substrate is obtained. At block 706, the second die is positioned relative to the first die by placing the second die at least partially in the cavity. At block 708, a coupler (e.g., coupler 118) configured to convey signals between the first device and the second device is provided. In some examples, the timing of blocks 708 and 706 is switched (the coupler is provided before the second die is positioned in the cavity) or performed at the same time.

In some examples, providing the coupler at block 708 involves adding a conductive material that extends between the first device and a surface of the first substrate associated with the cavity. In other examples, providing the coupler at block 708 involves adding at least one contactless coupler configured to convey wireless signals through the first substrate. In some examples, the method 700 also comprises positioning at least one contactless coupler component of the contactless coupler in the cavity.

Also, in some examples, the method 700 comprises etching the cavity in the first substrate, and selecting when to stop etching the cavity based on a predetermined size criteria for a base of the cavity. Additionally or alternatively, in some examples, the method 700 comprising etching the cavity in the first substrate, and selecting when to stop etching the cavity based on a predetermined post-etch thickness criteria (e.g., $\Delta HT$) for the first substrate. In some examples, the method 700 comprises hermetically sealing the second die inside the cavity (e.g., using a filler).

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Modifications are possible in the described embodiments, and other embodiments are possible, within the scope of the claims. In some examples, a multi-die module with a substrate cavity assembly includes a die with multiple devices. In such case, the number of substrate cavities and/or couplers varies as desired (e.g., one substrate cavity and one coupler, one substrate cavity and two couplers, two substrate cavities and one coupler, two substrate cavities and two couplers, etc.). Also, in some examples, if multiple dies are positioned in one or more substrate cavities, couplers enable signaling between the dies positioned in the one or more substrate cavities.

What is claimed is:

1. A multi-die module, comprising:
    a first die including a first substrate and a first device formed over the first substrate, the first substrate having a cavity on a side of the first substrate opposite the first device;
    a second die including a second substrate and a second device formed over the second substrate, the second die positioned at least partially in the cavity; and
    a coupler configured to convey signals between the first device and the second device, the coupler including first and second contactless coupler components, in which the first contactless coupler component is within a back-end stack (BEOL) layer or a redistribution layer (RDL) of the first die, and the second contactless coupler component is within a BEOL layer or RDL of the second die.

2. The multi-die module of claim 1, further comprising:
    a third die including a third substrate and a third device, the third die positioned at least partially in the cavity.

3. The multi-die module of claim 1, further comprising:
    a third die including a third substrate and a third device, the first substrate having a second cavity on the side of the first substrate opposite the first device, and the third die positioned at least partially in the second cavity.

4. The multi-die module of claim 1, wherein the coupler includes a conductive material that extends between the first device and the cavity.

5. The multi-die module of claim 1, wherein the first and second contactless coupler components are configured to convey wireless signals through the first substrate.

6. The multi-die module of claim 5, wherein at least one of the first or second contactless coupler components is positioned in the cavity.

7. The multi-die module of claim 1, wherein the cavity has a base that is larger than a footprint of the second die.

8. The multi-die module of claim 1, wherein the cavity has a base that matches a footprint of the second die.

9. The multi-die module of claim 1, wherein the cavity has a base that is smaller than a footprint of the second die.

10. The multi-die module of claim 1, wherein the cavity includes a step surface on which the second die is positioned.

11. The multi-die module of claim 1, further comprising a filler material between the second die and a base of the cavity.

12. The multi-die module of claim 1, wherein the second die is positioned on a base of the cavity.

13. The multi-die module of claim 1, wherein the second die fits within the cavity, and the cavity is filled with a filler material.

14. The multi-die module of claim 13, wherein the filler material seals the second die within the cavity.

15. The multi-die module of claim 1, wherein the first device includes an oscillator, and the second device includes a resonator.

16. A method for fabricating a multi-die module, the method comprising:
    obtaining a first die including a first device formed over a first substrate, the first substrate having a cavity on a side of the first substrate opposite the first device;
    obtaining a second die including a second substrate and a second device formed over the second substrate;
    positioning the second die at least partially in the cavity; and
    providing a coupler configured to convey signals between the first device and the second device, the coupler including first and second contactless coupler components, in which the first contactless coupler component is within a back-end stack (BEOL) layer or a redistribution layer (RDL) of the first die, and the second contactless coupler component is within a BEOL layer or RDL of the second die.

17. The method of claim 16, wherein providing the coupler includes adding a conductive material that extends between the first device and the cavity.

18. The method of claim 16, wherein the first and second contactless coupler components are configured to convey wireless signals through the first substrate.

19. The method of claim 18, further comprising positioning at least one of the first or second contactless coupler components in the cavity.

20. The method of claim 16, further comprising etching the cavity in the first substrate, and selecting when to stop etching the cavity based on a size criteria for a base of the cavity.

21. The method of claim 16, further comprising etching the cavity in the first substrate, and selecting when to stop etching the cavity based on a post-etch thickness criteria for a base of the cavity.

22. The method of claim 16, further comprising sealing the second die inside the cavity.

\* \* \* \* \*